(12) United States Patent
Kodaira

(10) Patent No.: US 9,078,355 B2
(45) Date of Patent: Jul. 7, 2015

(54) SEMICONDUCTOR DEVICE

(75) Inventor: Yoshihiro Kodaira, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/232,780

(22) PCT Filed: Aug. 24, 2012

(86) PCT No.: PCT/JP2012/071440
§ 371 (c)(1),
(2), (4) Date: Feb. 27, 2014

(87) PCT Pub. No.: WO2013/027826
PCT Pub. Date: Feb. 28, 2013

(65) Prior Publication Data
US 2014/0168922 A1     Jun. 19, 2014

(30) Foreign Application Priority Data

Aug. 25, 2011 (JP) ................ 2011-183836

(51) Int. Cl.
*H05K 5/02* (2006.01)
*H01L 25/07* (2006.01)
(Continued)

(52) U.S. Cl.
CPC ............ *H05K 5/0247* (2013.01); *H01L 25/072* (2013.01); *H01L 23/049* (2013.01);
(Continued)

(58) Field of Classification Search
CPC ....... H01L 23/10; H01L 23/053; H01L 23/34; H01L 23/36; H01L 23/49811; H01L 25/07; H01L 25/18; H01L 2924/00; H01L 2924/0002

USPC .......................... 257/584, 678, 693; 361/773
See application file for complete search history.

(56) References Cited

U.S. PATENT DOCUMENTS 5,243,223 A * 9/1993 Yamada et al. ................ 257/789
5,350,946 A * 9/1994 Murakami .................... 257/693
(Continued)

FOREIGN PATENT DOCUMENTS

JP    H07-099275 A    4/1995
JP    H08-007956 A    1/1996
(Continued)

OTHER PUBLICATIONS

Machine English Translation of JP 200-183276, Nakao Hiramoto, published Dec. 12, 1998.*
(Continued)

*Primary Examiner* — Peniel M Gumedzoe
(74) *Attorney, Agent, or Firm* — Manabu Kanesaka

(57) ABSTRACT

A semiconductor device has a control terminal attached to a patterned insulating substrate; a first projection formed on the control terminal; a second projection formed on the control terminal; a concave formed between the first projection and the second projection; a resin case disposed to cover the patterned insulating substrate, and having an opening for passing the control terminal therethrough; a first concave portion; a beam portion disposed at the opening of the resin case; a second concave portion formed in the beam portion; a resin block inserted into the opening of the resin case and sandwiching the control terminal together with the sidewall of the opening of the resin case to fix the control terminal to the resin case; a convex step portion; a third projection formed on a side surface of the resin block; and a fourth projection thinned on a bottom surface of the resin block.

6 Claims, 15 Drawing Sheets

(51) Int. Cl.
*H01L 23/049* (2006.01)
*H01L 23/498* (2006.01)
*H01L 23/373* (2006.01)

(52) U.S. Cl.
CPC ...... *H01L23/49811* (2013.01); *H01L 23/3735* (2013.01); *H01L 2224/291* (2013.01); *H01L 2224/32225* (2013.01); *H01L 2924/13055* (2013.01); *H01L 2924/1305* (2013.01)

(56) References Cited

U.S. PATENT DOCUMENTS 5,606,200 A * 2/1997 Haraguchi et al. ............ 257/687
6,597,585 B2 7/2003 Ferber et al.
2009/0050957 A1 * 2/2009 Nakao ............................ 257/328
2011/0069458 A1 3/2011 Nakao et al.

FOREIGN PATENT DOCUMENTS

| JP | 3025083 U | 3/1996 |
| JP | H11-168168 A | 6/1999 |
| JP | 2000-183276 A | 6/2000 |
| JP | 2000-208686 A | 7/2000 |

OTHER PUBLICATIONS

PCT, "International Search Report for International Application No. PCT/JP2012/071440", Mailing date of Oct. 30, 2012.

* cited by examiner

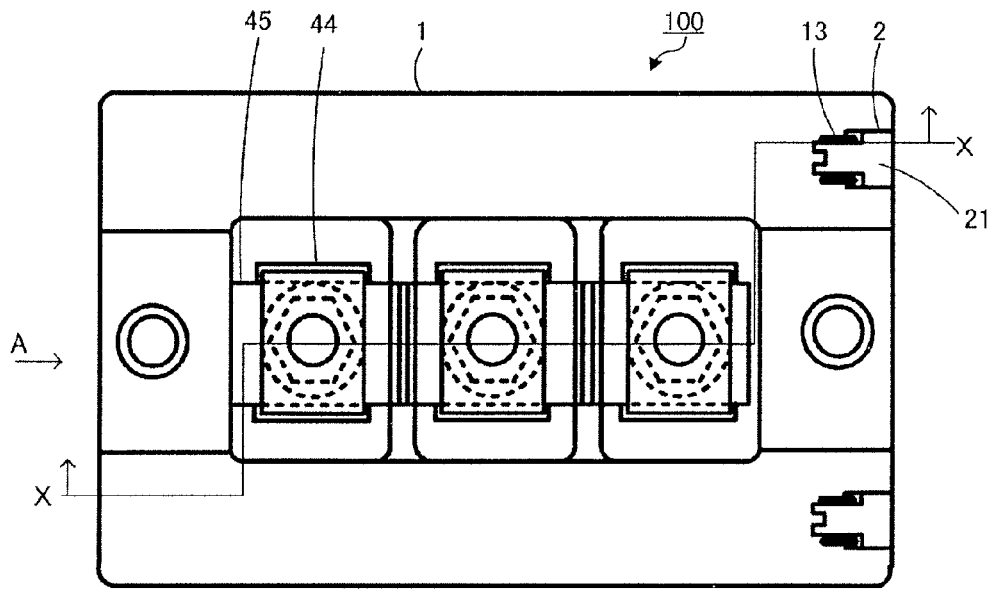
Fig. 1(a)
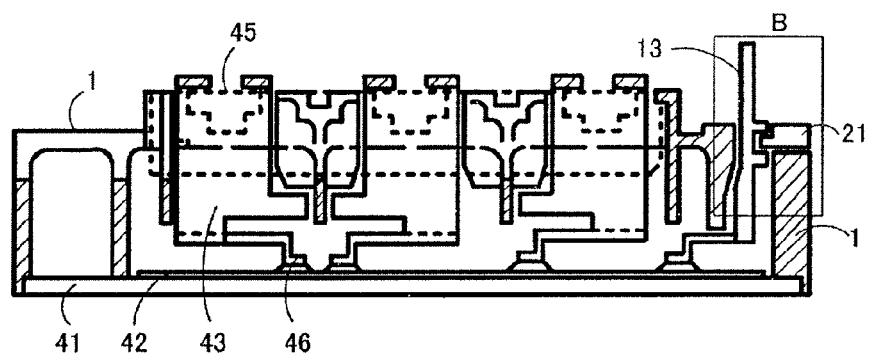
Fig. 1(b)
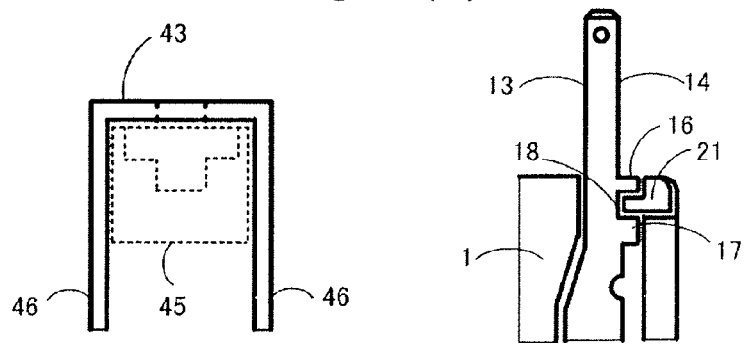
Fig. 1(c)   Fig. 1(d)

SEMICONDUCTOR DEVICE

RELATED APPLICATIONS

The present application is National Phase of International Application No. PCT/JP2012/071440 filed Aug. 24, 2012, and claims priority from Japanese Application No. 2011-183836 filed Aug. 25, 2011.

TECHNICAL FIELD

The present invention relates to a semiconductor device in which a control terminal can highly accurately be fixed to a resin case.

BACKGROUND ART

A conventional IGBT module has been known in which a main terminal and a control terminal, which are external lead terminals, are soldered onto a conductive pattern (circuit pattern) formed on an insulating substrate (referred hereinafter as "patterned insulating substrate") (see Patent Document 1 below, for example). Patent Document 1 uses independent terminals as the external lead terminals. The independent terminals are not fixed to a resin case, wherein they are not insert-molded into a resin case. The independent terminals are electrically connected to external wiring by nut globes which are resin structures of nuts and nut receivers fitted together.

With the recent increase in the integration density of an IGBT module, the joint between the patterned insulating substrate and the external lead terminals of the package needs to be strong and reliable in the assembly of the IGBT module. In addition, the positions to dispose the external lead terminals of the package need to be precise when mounting the external lead terminals on the patterned insulating substrate. A configuration of a conventional IGBT module is now described with reference to FIG. 19.

FIG. 19 is a cross-sectional diagram showing the configurations of substantial parts of the conventional IGBT module with independent terminals. A main terminal 53 and a control terminal 54, which are the independent terminals, are soldered or welded to a patterned insulating substrate 52 which is fixedly attached onto a heat dissipating base 51. A resin case 55 is bonded to the rim of the heat dissipating base 51. The part of the heat dissipating base 51 that is near the patterned insulating substrate 52 is covered with the resin case 55. Openings 56, 57 are formed in this resin case 55, so that the main terminal 53 and the control terminal 54 are exposed to the outside of the resin case 55 through the openings 56, 57.

Patent Document 1: U.S. Pat. No. 6,597,585

A problem with the conventional IGBT module shown in FIG. 19 is that the control terminal 54 sinks into the resin case 55 when a compressive load is applied to the control terminal 54. In a case where the control terminal 54 is welded to the patterned insulating substrate 52 or the control terminal 54 is deformed very little, the patterned insulating substrate 52 can be damaged by a compressive load applied to the control terminal 54.

Another problem is that a tensile load applied to the control terminal 54 tears the joint between the control terminal and the patterned insulating substrate 52, pulling the control terminal 54 out of the resin case 55. Because this conventional structure allows the control terminal 34 to move easily, it is difficult to highly accurately position and fix the control terminal 54 in the resin case 55. The control terminal 54 is deformed easily especially when the arm portion thereof is long, making an accurate positioning of the control terminal 54 more difficult.

DISCLOSURE OF THE INVENTION

In order to solve the problems of the prior art mentioned above, it is an object of the present invention to provide a semiconductor device in which a control terminal is prevented from moving up and down and can be fixed to a resin case, even when a compressive load or tensile load is applied to the control terminal, and a method of manufacturing such semiconductor device. In order to solve the problems of the prior art mentioned above, another object of the present invention is to provide a semiconductor device in which the position of the control terminal can be determined precisely, and a method of manufacturing the semiconductor device.

The semiconductor device according to the present invention has the following characteristics for the purpose of solving the foregoing problems and achieving the objects of the present invention. A control terminal is attached to a patterned insulating substrate. A first projection is formed on the control terminal. A second projection is formed on the control terminal away from the first projection. A concave is formed between the first projection and the second projection. A resin case having an opening for passing the control terminal therethrough is disposed to cover the patterned insulating substrate. A first concave portion is formed on a sidewall of the opening of the resin case. A beam portion is disposed at a bottom portion of the opening of the resin case. A second concave portion is formed in the beam portion. A resin block is inserted into the opening of the resin case and sandwiches the control terminal with the sidewall of the opening of the resin case to fix the control terminal to the resin case. A convex step portion to be fitted into the concave of the control terminal is formed in the resin block. A third projection to be fitted into the first concave portion is formed on a side surface of the resin block. A fourth projection to be fitted into the second concave portion is formed on a bottom surface of the resin block.

According to the foregoing invention, in the semiconductor device of the present invention, the bottom surface of the resin block and the beam portion may be fixed with an adhesive.

According to the foregoing invention, in the semiconductor device of the present invention, the beam portion may be provided with a liquid reservoir preventing the adhesive in a liquid state from flowing toward the control terminal.

The semiconductor device according to the present invention has the following characteristics for the purpose of solving the abovementioned problems and achieving the objects of the present invention. A control terminal is attached to a patterned insulating substrate. A resin case having an opening for passing the control terminal therethrough is disposed to cover the patterned insulating substrate. A first step portion is formed on the upper side of a sidewall of the opening of the resin case to project toward inside of the opening. A resin block is inserted into the opening of the resin case and sandwiches the control terminal with the sidewall of the opening of the resin case to fix the control terminal to the resin case. A convex second step portion is formed on a side surface of the resin block and has an inclined upper surface contacting the first step portion to fit.

The semiconductor device according to the present invention has the following characteristics for the purpose of solving the abovementioned problems and achieving the objects of the present invention. A control terminal is attached to a patterned insulating substrate. A resin case having an opening for passing the control terminal therethrough is disposed to cover the patterned insulating substrate. A resin block is inserted into the opening of the resin case to contact a part of the control terminal and turning the part of the control terminal to a predetermined position to determine the position of the control terminal.

The method of manufacturing a semiconductor device according to the present invention is a method of manufacturing a semiconductor device including a control terminal attached to a patterned insulating substrate, and a resin case disposed to cover the patterned insulating substrate and has an opening for passing the control terminal therethrough. The method has the following characteristics for the purpose of solving the abovementioned problems and achieving the objects of the present invention. First, the control terminal is passed through the opening of the resin case to partially expose the control terminal from the opening, and the resin case is disposed to cover the patterned insulating substrate. Next, a resin block is inserted and installed in the opening of the resin case, and a convex step portion formed on a side surface of the resin block is fitted into a concave formed between two projections of the control terminal. A projection formed on the side surface of the resin block is fitted into a concave portion formed on a sidewall of the opening of the resin case. In addition, a projection formed on a bottom surface of the resin block is fitted into a concave portion formed in a beam portion at a bottom of the opening of the resin case. Consequently the control terminal, the resin case, and the resin block are fitted together, positioning and fixing the control terminal.

According to the foregoing invention, the method of manufacturing a semiconductor device may further include a step of applying an adhesive to the beam portion in order to bond the resin block to the resin case.

The method of manufacturing a semiconductor device according to the present invention is a method of manufacturing a semiconductor device including a control terminal attached to a patterned insulating substrate, and a resin case disposed to cover the patterned insulating substrate and has an opening for passing the control terminal therethrough. The method has the following characteristics for the purpose of solving the abovementioned problems and achieving the objects of the present invention. First, the method performs a step of covering the patterned insulating substrate with the resin case and passing a part of the control terminal through the opening of the resin case. Next, the method performs a step of determining the position of the control terminal by inserting a resin block into the opening of the resin case, contacting the resin block with a part of the control terminal, and turning the part of the control terminal to a predetermined position.

According to the foregoing invention, the method of manufacturing a semiconductor device according to the present invention resides in that the part of the control terminal is turned by the resin block until the control terminal contacts the sidewall of the opening of the resin case which is at a front in a direction of insertion of the resin block.

According to the foregoing invention, the method of manufacturing a semiconductor device according to the present invention resides in that an inclined upper surface of a convex step portion formed on a side surface of the resin block is fitted to a step portion projecting toward inside of the opening of the resin case on the upper side of the sidewall of the opening to fix the resin block to the resin case.

According to the present invention, because the two projections provided on a side end surface of the control terminal are fitted to the convex step portion of the resin block that is inserted into the opening of the resin case, the control terminal can be fixed to the resin case so as not to be moved by external force. Hence, even when external force such as a compressive load or tensile load is applied to the control terminal, the control terminal can be prevented from sinking into the resin case or being pulled out of the resin case.

Further, according to the present invention, as a result of holding the control terminal between the side surface of the resin block and the sidewall of the opening of the resin case and fitting the convex step portion of the resin block into the valley between the two projections of the control terminal, the control terminal can be fixed in place in the resin case. Thus, the position of the control terminal can be determined highly accurately.

The semiconductor device and the method of manufacturing the same according to the present invention exerts the effect of fixing the control terminal to the resin case without causing vertical movement of the control terminal, even when a compressive load or tensile load is applied to the control terminal. The semiconductor device and the method of manufacturing the same according to the present invention can also exert the effect of positioning the control terminal with a high degree of accuracy.

BRIEF DESCRIPTION OF THE DRAWINGS

FIGS. 1(a)-1(d) are explanatory diagrams showing the configurations of substantial parts of a semiconductor device according to Embodiment 1 of the present invention.

BEST MODE FOR CARRYING OUT THE INVENTION

Figure 2A:
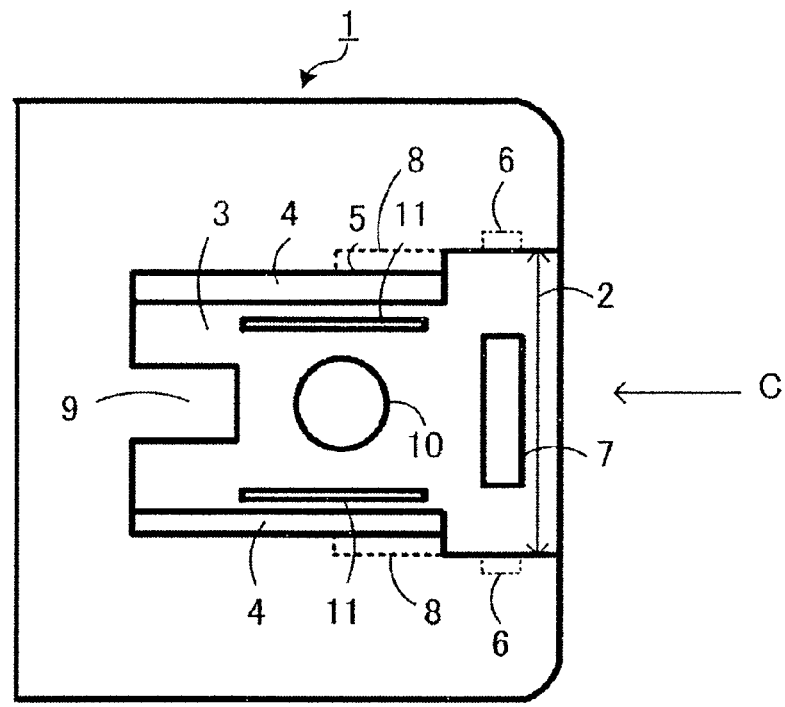
FIGS. 2(a), 2(b) are explanatory diagrams showing the configurations of substantial parts near a control terminal of a resin case shown in FIGS. 1(a)-1(d).

Preferred embodiments of a semiconductor device and a method of manufacturing the same according to the present invention are now described below in detail with reference to the accompanying drawings. In the following description of each embodiment and the accompanying drawings, like reference characters are used for indicating the same configurations, and therefore the overlapping explanations are omitted accordingly.

(Embodiment 1)

The configurations of the semiconductor device according to the present invention are described with reference to FIGS. 1(a) to 6. FIGS. 1(a)-1(d) are explanatory diagrams showing the configurations of substantial parts of a semiconductor device according to Embodiment 1 of the present invention. FIG. 1(a) is a top view of the semiconductor device 100 according to Embodiment 1. FIG. 1(b) is a side view taken along the line X-X of FIG. 1(a). FIG. 1(c) is a front view of a main terminal 43 which is viewed in the direction of the arrow A shown in FIG. 1(a). FIG. 1(d) is a cross-sectional diagram showing the detail of a rectangular section B shown in FIG. 1(b). This semiconductor device 100 is, for example, an IGBT module.

As shown in FIGS. 1(a)-1(d), the semiconductor device 100 has a resin case 1, a heat dissipating base 41, a patterned insulating substrate 42, a nut globe 45, a main terminal 43, a control terminal 13, and a resin block 21. The patterned insulating substrate 42 is fixedly attached to the heat dissipating base 41. The resin case 1 is bonded to the rim of the heat dissipating base 41 to cover the part of the heat dissipating base 41 which is near the patterned insulating substrate 42. The main terminal 43 and control terminal 13, the independent terminals led (connected) to the outside, are soldered or welded onto the patterned insulating substrate 42. The main terminal 43 and control terminal 13 are independent terminals which are not insert-molded to the resin case 1.

The main terminal 43 and control terminal 13 are exposed to the outside of the resin case 1 from an opening 44 and an opening 2, respectively, which are formed on an upper surface of the resin case 1. The main terminal 43 and control terminal 13 are fixed by the nut globe 45 and the resin block 21, respectively. In particular, the main terminal 43 is in the shape of a reversed "U" in which the upper part (bottom part of the "U") is exposed to the outside of the resin case 1 from the opening 44 of the upper surface of the resin case 1. The two leg portions 46 of the main terminal 43 (the open ends of the "U") are soldered or welded to the patterned insulating substrate 42. The nut globe 45 is inserted between the two leg portions 46 of the main terminal 43 so as to go under the U-shaped curve of the main terminal 43 from the opening 44 formed on a side surface of the resin case 1 in order to fixate the main terminal 43.

The control terminal 13 is provided substantially upright on the patterned insulating substrate 42 and configured by an upright portion having its one end exposed to the outside of the resin case 1 and a coupled portion that is coupled to the other end of the upright portion to form a substantially L-shape together with the upright portion. One end of the coupled portion of the control terminal 13, opposite to an end of the same near the upright portion, is soldered or welded to the patterned insulating substrate 42 via a joint which is provided substantially upright on the patterned insulating substrate 42. A side end surface (simply referred to as "side end surface" hereinafter) 14 of the upright portion of the control terminal 13 is provided with first and second projections 16 and 17 and a concave valley 18 formed between the first projection 16 and the second projection 17. The resin block 21 is fitted into the valley 18 of the control terminal 13, thereby positioning and fixating the control terminal 13.

Figure 2B:
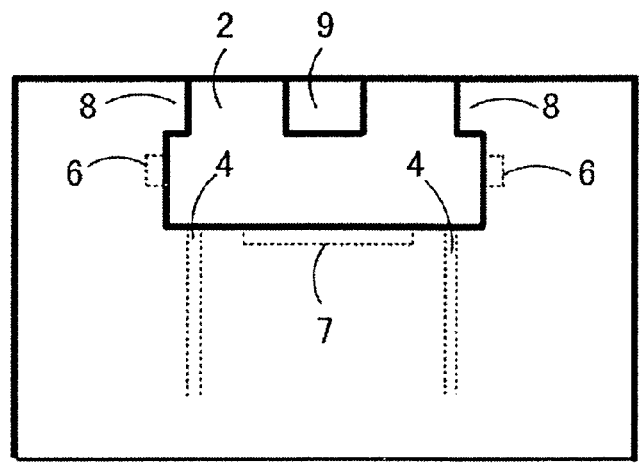

The configurations of the vicinity of the control terminal 13 of the resin case 1, the control terminal 13, and the resin block 21 are now described in detail. FIGS. 2(a), 2(b) are explanatory diagrams showing the configurations of substantial parts near the control terminal of the resin case shown in FIGS. 1(a)-1(d). FIG. 2(a) is a plan view of the resin case 1. FIG. 2(b) is a front view of the resin case 1, showing FIG. 2(a) in the direction of the arrow C. The resin case 1 has one opening 2 that is formed so as to be connected to the upper surface and side surface of the resin case 1. A beam portion 3 is formed in the bottom of this opening 2. First hood portions (first step portions) 8, convexed to project from either sidewall 5 of the opening 2 toward the inside of the opening 2, are formed on the upper side of either sidewall 5 of the opening 2.

A second hood portion (step portion) 9, convexed to project toward the inside of the opening 2, is formed on a front sidewall of the opening 2. The front sidewall of the opening 2 is a sidewall positioned to face the mouth of the opening 2, which is located near the side surface of the resin case 1. First concave portions 6 are formed on either sidewall 5 of the opening 2 so as to extend to the outside of the opening 2. The first concave portions 6 are disposed away from the first hood portions 8. A second concave portion 7 is formed in the beam portion 3 so as to extend downward (toward the heat dissipating base 41). In addition, a through-hole 4, through which the control terminal 13 is passed, is formed in the beam portion 3. Further, a third concave portion 10 and liquid reservoirs 11 are formed in the beam portion 3. An adhesive, not shown, is dropped (or applied) onto the third concave portion 10. The liquid reservoirs 11 prevent the adhesive from flowing toward the control terminal 13.

Figure 3A:
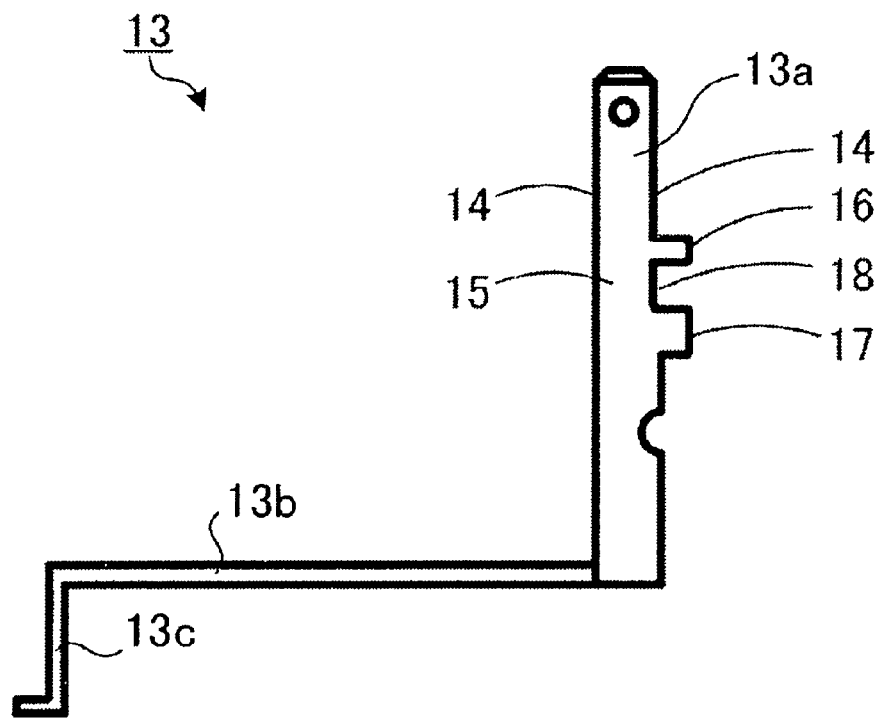
FIGS. 3(a), 3(b) are explanatory diagrams showing the configurations of the control terminal shown in FIGS. 1(a)-1(d).
Figure 3B:
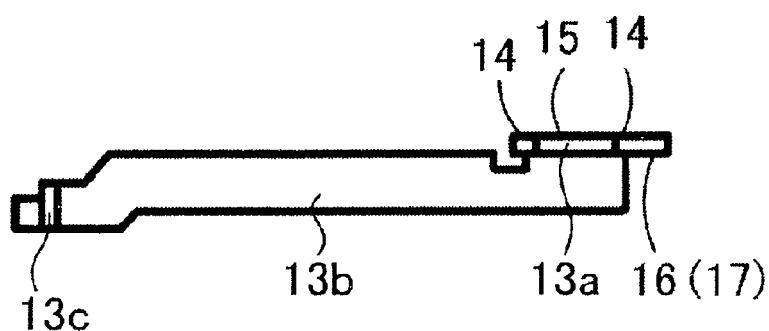

FIGS. 3(a), 3(b) are explanatory diagrams showing the configuration of the control terminal shown in FIGS. 1(a)-1(d). FIG. 3(a) is a side view of the control terminal 13. FIG. 3(b) is a top view of the control terminal 13. The two projections, the first and second projections 16 and 17, are formed side by side on the side end surface 14 of the control terminal 13. The side end surface 14 of the control terminal 13 also has the valley 18 formed between the first and second projections 16 and 17. As will be described below, a front end 27 of a convex step portion (second step portion) 26, formed on each side surface 22 of the resin block 21, is fitted into the valley 18. Reference numeral 15 shown in FIGS. 3(a), 3(b) represents a flat plate configuring the upright portion of the control terminal 13 (simply referred to as "flat plate" hereinafter). The front end 27 of the step portion 26 faces the side end surface 14 of the control terminal 13 after assembly of the semiconductor device 100. Reference numerals 13a to 13c represent the upright portion, coupled portion, and joint of the control terminal 13, respectively.

Figure 4A:
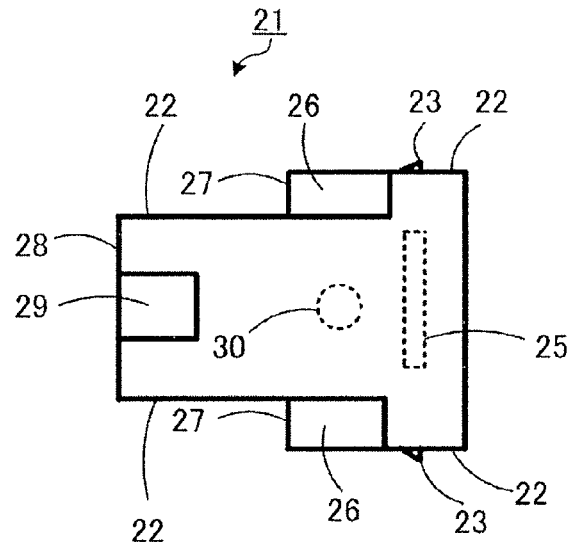
FIGS. 4(a)-4(c) are explanatory diagrams showing the configurations of a resin block for positioning and fixing the control terminal shown in FIGS. 1(a)-1(d).
Figure 4B:
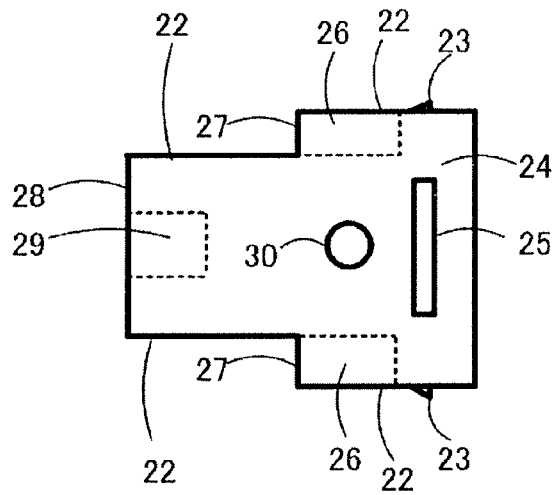
Figure 4C:
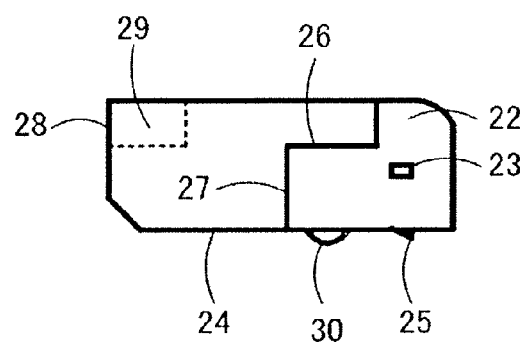

FIGS. 4(a)-4(c) are explanatory diagrams showing a configuration of the resin block by which the control terminal shown in FIGS. 1(a)-1(d) are positioned and fixated. FIG. 4(a) is a top view of the resin block 21. FIG. 4(b) is a bottom view of the resin block 21. FIG. 4(c) is a side view of the resin block 21. Third projections 23 are formed on each of the side surfaces 22 of the resin block 21. A fourth projection 25 is formed on a bottom surface 24 of the resin block 21. The convex step portion 26 is formed on each side surface 22 of the resin block 21.

The convex step portion 26 is formed on the lower side of each side surface 22 of the resin block 21, at a rear end of the resin block 21. The rear end of the resin block 21 is positioned at the mouth of the opening 2 on the side surface of the resin case 1 after assembly of the semiconductor device 100. A concave groove 29 is formed at a front end 28 of the resin block 21. The front end 27 of the convex step portion 26 is fitted into the valley 18 formed between the first and second projections 16 and 17 of the control terminal 13. The front end of the resin block 21 is positioned to face the front sidewall of the opening 2 of the resin case 1 after assembly of the semiconductor device 100.

Figure 5A:
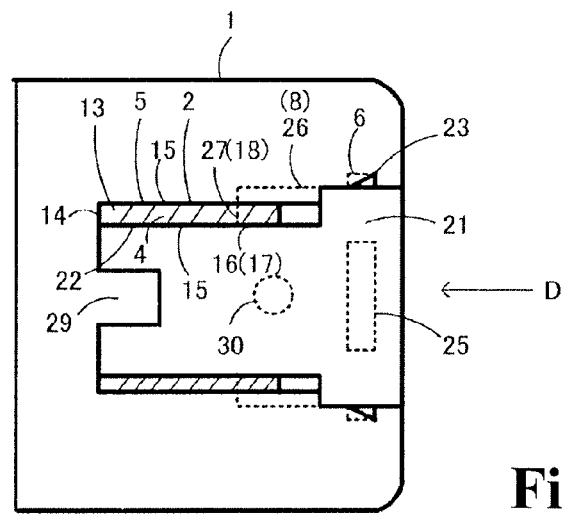
FIGS. 5(a)-5(c) are explanatory diagrams showing the control terminal and resin block inserted in an opening of the resin case shown in FIGS. 2(a), 2(b).
Figure 5B:
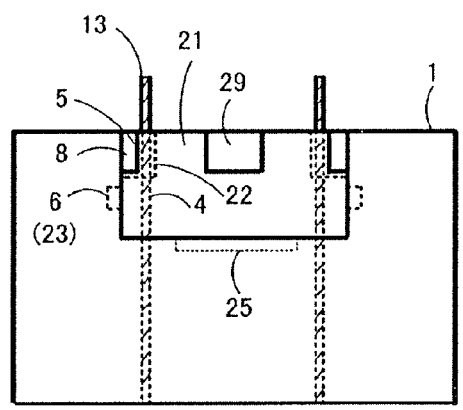
Figure 5C:
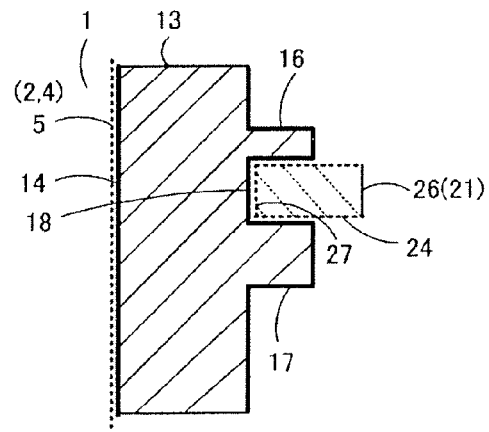

FIGS. 5(a)-5(c) are explanatory diagrams showing the control terminal and resin block inserted and installed in the opening of the resin case shown in FIGS. 2(a), 2(c). FIG. 5(a) is a plan view showing the control terminal 13 and the resin block 21 inserted and installed in the opening 2 of the resin case 1. FIG. 5(b) is a front view viewed in the direction of the arrow D shown in FIG. 5(a). FIG. 5(c) is a cross-sectional diagram showing the front end 27 of the convex step portion 26 on each side surface 22 of the resin block 21 fitted into the valley 18 formed between the first and second projections 16 and 17 of the control terminal 13.

The flat plate 15 of the control terminal 13 is pressed by each sidewall 5 of the opening 2 of the resin case 1 and each side surface 22 of the resin block 21, thereby fixing the control terminal 13 in place in a direction perpendicular to the direction of the arrow D (a direction perpendicular to the flat plate 15 of the control terminal 13). The front end 27 of the convex step portion 26 on each side surface 22 of the resin block 21 is fitted into the valley 18 formed between the first and second projections 16 and 17 of the control terminal 13, thereby fixing the control terminal 13 in place in the direction of the arrow D. In this manner, the control terminal 13 can be positioned and fixed accurately by pressing the flat plate 15 and side end surface 14 of the control terminal 13 using the sidewall 5 of the opening 2 of the resin case 1 and the resin block 21.

A method of manufacturing the semiconductor device 100 shown in FIGS. 1(a)-1(d) is described next. As shown in FIGS. 1(a)-1(d), after soldering the patterned insulating substrate 42 onto the heat dissipating base 41, the main terminal 43 and the control terminal 13, which are the independent terminals, are soldered onto the patterned insulating substrate 42. In particular, the two leg portions 46 of the main terminal 43 are soldered to the patterned insulating substrate 42. The joint of the control terminal 13 is soldered to the patterned insulating substrate 42.

The patterned insulating substrate 42 is then covered by the resin case 1 in such a manner that the upper surface of the main terminal 43 and the upper part of the control terminal 13 are exposed to the outside of the resin case 1, and then the lower part of the resin case 1 is bonded to the rim of the heat dissipating base 41. Thereafter, the nut globe 45 is inserted and installed so as to go under the main terminal 43 from the opening 44 provided on the side surface of the resin case 1. The nut globe 45 is a resin structure of a nut and a nut receiver fitted together and is in the shape of, for example, a cuboid (a rod-like cuboid). The nut is fitted into the nut receiver so as to be capable of moving vertically freely in the nut receiver.

The main terminal 43 is in the shape of a reversed "U" as shown in FIG. 1(c), and the nut globe 45 is inserted and installed so as to go under the U-shaped curve of the main terminal 43. The upper part of this main terminal 43 is exposed to the outside of the resin case 1. A mounting hole to be mounted on external wiring is formed in the upper part of the main terminal 43 which is exposed to the outside of the resin case 1. Then, the control terminal 13 shown in FIGS. 3(a), 3(b) is inserted into each through-hole 4 at the bottom of the opening 2 of the resin case 1 shown in FIGS. 2(a), 2(b), and the resin block 21 shown in FIGS. 4(a)-4(c) is inserted and installed in a lateral direction from the opening 2 on either side surface of the resin case 1, to accurately position and fix the control terminal 13. The lateral direction here means a direction parallel to a main surface of the patterned insulating substrate 42.

At this moment, the front end 27 of the convex step portion 26 on each side surface 22 of the resin block 21 is fitted into the valley 18 between the first and second projections 16 and 17 of the control terminal 13. Hence, the front end 27 of the convex step portion 26 on each side surface 22 of the resin block 21 is hooked on the second projection 17 when a compressive load is applied to the control terminal 13, and on the first projection 16 when a tensile load is applied to the same. This can prevent the control terminal 13 from sinking into the resin case 1 or being pulled out of the resin case 1.

Because the flat plate 15 and side end surface 14 of the control terminal 13 are held between the opening 2 of the resin case 1 and the resin block 21, the control terminal 13 is positioned and fixed in the resin case 1, as accurately as the external lead terminals that are insert-molded into the resin case 1. Moreover, even when the control terminal 13 is deformed, holding the flat plate 15 and side surface 14 of the control terminal 13 between the opening 2 of the resin case 1 and the resin block 21 can correct the deformation.

When the resin block 21 is inserted into the opening 2 of the resin case 1, the third projections 23 on either side surface 22 of the resin block 21 and the fourth projection 25 on the bottom surface 24 of the resin block 21 are fitted into the first concave portions 6 of the sidewalls 5 of the opening 2 of the resin case 1 and the second concave portion 7 of the beam portion 3 at the bottom of the opening 2 of the resin case 1, respectively. As a result, the resin block 21 can accurately be positioned and fixed in the resin case 1.

When the resin block 21 is inserted into the opening 2 of the resin case 1, the convex step portion 26 that is formed on the lower side of each side surface 22 of the resin block 21 is fitted under the first hood portion 8 formed on the upper side of the opening 2 of the resin case 1. In addition, the second hood portion 9 that is formed on the front sidewall of the opening 2 of the resin case 1 is fitted into a concave groove 29 formed at the front end 28 of the resin block 21. This further fixes the resin block 21 to the resin case 1. The term "front" indicates the direction in which the resin block 21 is inserted from the opening 2 on each side of the resin case 1. The upper and front surfaces of the resin block 21 that are fitted into the resin case 1 are exposed from the resin case 1.

Further, the bottom surface 24 of the resin block 21 and the beam portion 3 at the bottom of the opening 2 of the resin case 1 are fixed by an adhesive which is not shown. The beam portion 3 is provided with a liquid reservoir 11, a groove for catching a liquid adhesive so that it does not flow to the control terminal 13 prior to the fixation, as shown in FIGS. 2(a), 2(b). The third concave portion 10 is formed in the center of the beam portion 3 in which the liquid adhesive is disposed, and a fifth projection 30 on the bottom surface 24 of the resin block 21 is fitted into the third concave portion 10.

In this manner, stronger fixation between the resin case 1 and the resin block 21 can be realized by fitting and bonding the resin case 1 and the resin block 21 to each other by means of the adhesive.

As described above, the control terminal 13 can accurately be positioned and fixed in the resin case 1 by inserting the front end 27 of the convex step portion 26 of the resin block 21 into the valley 18 formed between the first and second projections 16 and 17 of the control terminal 13. This can consequently prevent the control terminal 13 from sinking into the resin case 1 when a compressive load is applied to the control terminal 13. The control terminal 13 can also be prevented from being pulled out of the resin case 1 when a tensile load is applied to the control terminal 13.

The side surfaces 22 and the bottom surface 24 of the resin block 21 are provided respectively with the third projections 23 and the fourth projection 25, and the sidewalls 5 and the beam portion 3 of the opening 2 of the resin case 1 are provided respectively with the first concave portions 6 and the second concave portion 7. Fitting the third projections 23 into the first concave portions 6 and the fourth projection 25 into the second concave portion 7 can prevent the resin block 21 from being removed from the resin case 1.

Figure 6:
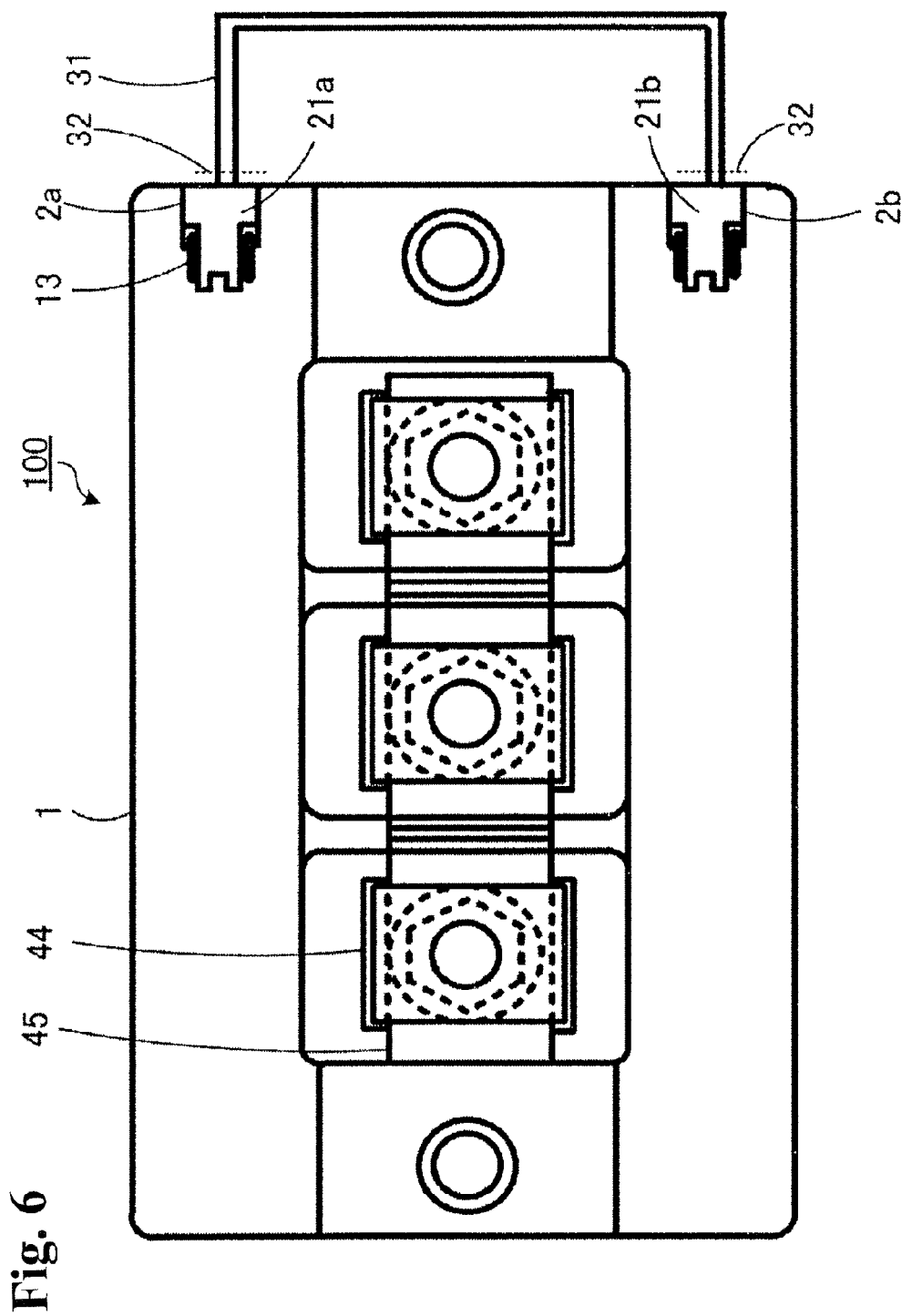
FIG. 6 is an explanatory diagram showing an example of a method of inserting the resin block of FIGS. 1(a)-1(d) into the resin case.

When the plurality of control terminals 13 is joined to the patterned insulating substrate 42, the semiconductor device 100 may have the resin case 1 having as many openings 2 as the number of the control terminals 13 and as many resin blocks 21 as the number of the openings 2 of the resin case 1. In this case, for example, the resin blocks 21 may be inserted into the openings 2 of the resin case 1, respectively. FIG. 6 is an explanatory diagram showing an example of a method of inserting the resin block of FIGS. 1(a)-1(d) into the resin case. An example in which the semiconductor device 100 has the resin case 1 with two openings 2 (openings 2a, 2b, hereinafter) and two resin blocks 21 (resin blocks 21a, 21b, hereinafter) is now described.

As shown in FIG. 6, upon resin-molding of the resin blocks 21a, 21b, the resin blocks 21a, 21b are previously connected to each other by means of a connector 31 leaving therebetween a space equal to the space between the openings 2a, 2b of the resin case 1. After inserting and installing the resin blocks 21a, 21b into the openings 2a, 2b of the resin case 1, the connector 31 (also referred to as "runner") is cut, for example, at the positions of the dashed lines 32 near the openings 2a, 2b of the resin case 1, thereby removing the connector 31. By inserting the resin blocks 21a, 21b into the openings 2a, 2b of the resin case 1 in the manner described above, the resin blocks 21a, 21b can be inserted and installed efficiently into the resin case 1, improving the ease of assembly of the semiconductor device 100.

Furthermore, increasing the size of the third projections 23 on the side surfaces 22 of the resin block 21 shown in FIGS. 1(a)-1(d) can improve the fitting between the resin block 21 and the resin case 1. Hence, the resin block 21 can accurately be fixed to the resin case 1 without using an adhesive. In so doing, the fourth projection 25 is not necessarily formed on the bottom surface 24 of the resin block 21.

Although the main terminal 43 and the control terminal 13 are described as the independent terminals in Embodiment 1, the main terminal 43 is not necessarily an independent terminal.

(Embodiment 2)

The method of manufacturing a semiconductor device according to the present invention is now described in detail. FIGS. 7(a) to 10(b) are each an explanatory diagram showing a semiconductor device of Embodiment 2 of the present invention in process of manufacture. The method of manufacturing a semiconductor device according to Embodiment 2 is a method of manufacturing the semiconductor device 100 of Embodiment 1 shown in FIGS. 1(a) to 6. Throughout FIGS. 7(a) to 10(b), (a) is a cross-sectional diagram showing the entire semiconductor device 100, and (b) is an enlarged plan view showing the area near the control terminal 13.

Figure 7A:
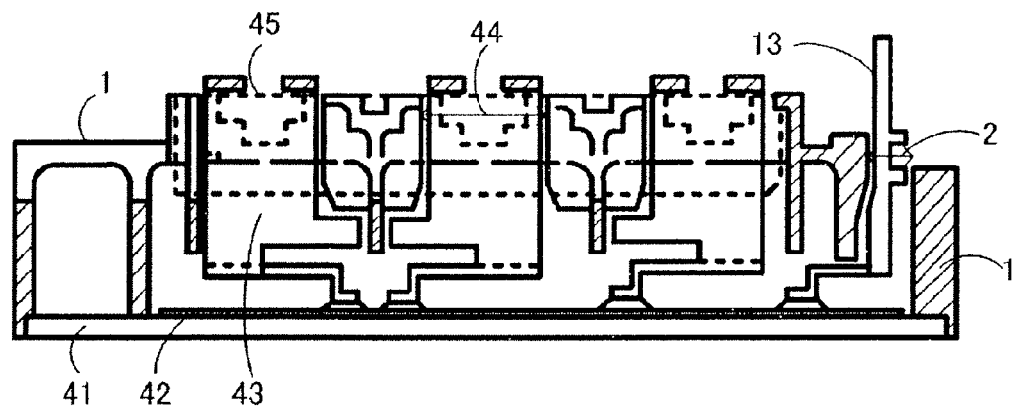
FIGS. 7(a), 7(b) are explanatory diagrams showing a semiconductor device of Embodiment 2 of the present invention in process of manufacture.
Figure 7B:
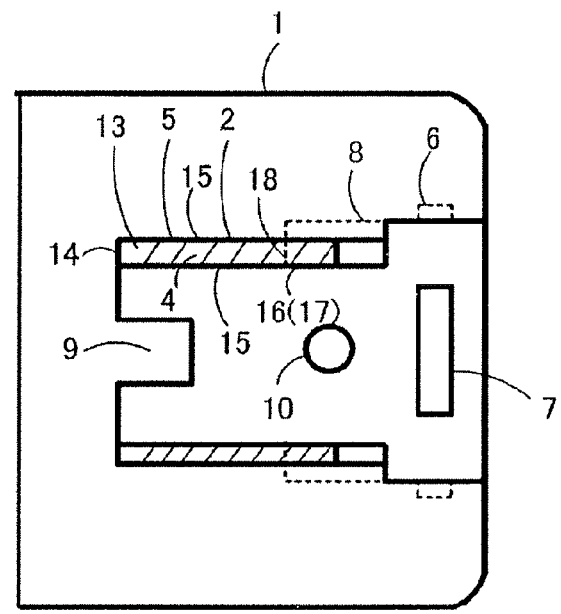

As shown in FIGS. 7(a), 7(b), a semiconductor chip (not shown), the main terminal 43, and the control terminal 13 are fixated onto the patterned insulating substrate 42 by means of soldering (or sometimes welding), the patterned insulating substrate 42 being fixated onto the heat dissipating base 41. Next, the resin case 1 is installed so as to cover the patterned insulating substrate 42. The main terminal 43 is exposed from the upper side of the opening 44 of the resin case 1, and the control terminal 13 is passed through the through-hole 4 formed in the bottom of the opening 2. Subsequently, the lower part of the resin case 1 is bonded to the rim of the heat dissipating base 41. The nut globe 45 is then passed under the main terminal 43 so as to be fixed to the resin case 1.

Figure 8A:
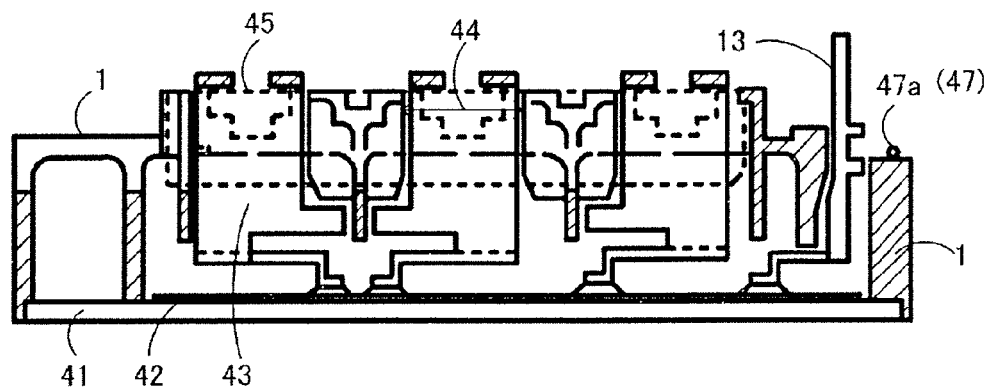
FIGS. 8(a), 8(b) are explanatory diagrams showing the semiconductor device of Embodiment 2 of the present invention which is in a manufacturing step following the one shown in FIGS. 7(a), 7(b).
Figure 8B:
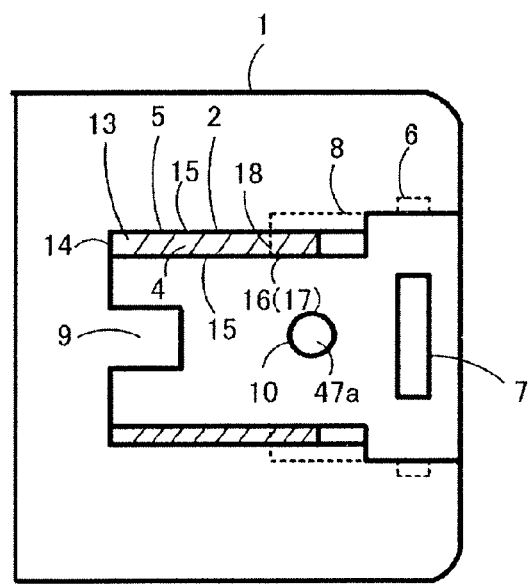

Next, as shown in FIGS. 8(a), 8(b), a liquid adhesive 47a is dropped (or applied) onto the third concave portion 10 which is formed in the beam portion 3 provided in the bottom of the opening 2 of the resin case 1.

Figure 9A:
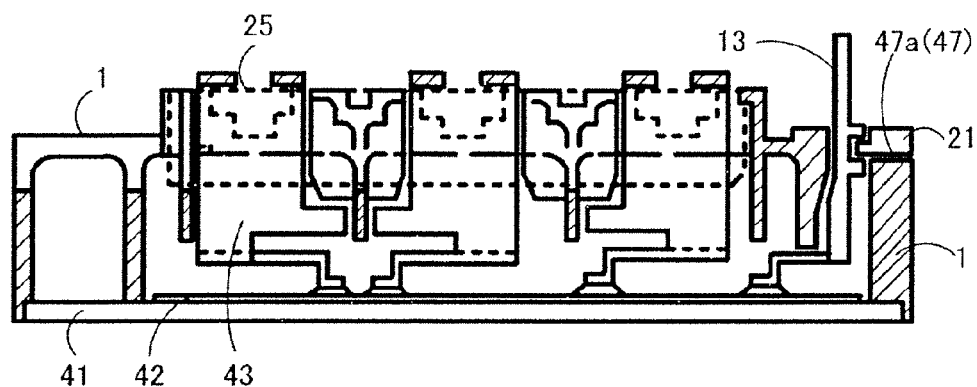
FIGS. 9(a), 9(b) are explanatory diagrams showing the semiconductor device of Embodiment 2 of the present invention which is in a manufacturing step following the one shown in FIGS. 8(a), 8(b).
Figure 9B:
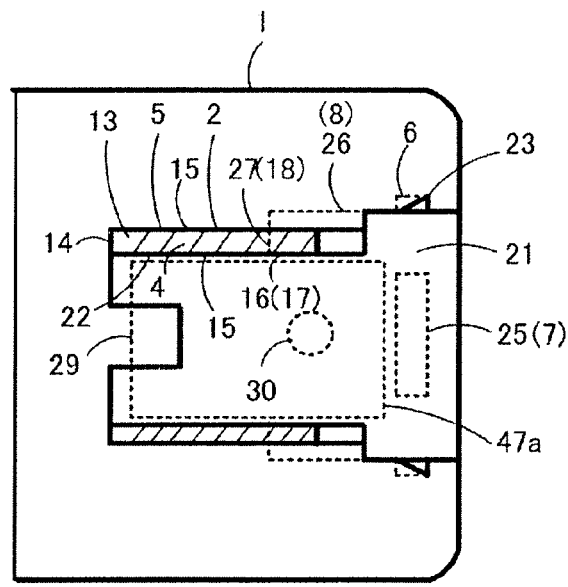

Next, the resin block 21 is inserted and installed in the opening 2 of the resin case 1, as shown in FIGS. 9(a), 9(b). In so doing, the front end 27 of the convex step portion 26 on each side surface 22 of the resin block 21 is fitted into the valley formed between the first and second projections 16 and 17 (two projections) of the control terminal 13. The third projections 23 of the resin block 21 are fitted into the first concave portions 6 formed on the sidewalls 5 of the opening 2 of the resin case 1, and the fourth projection 25 of the resin block 21 is fitted into the second concave portion 7 formed in the beam portion 3 in the bottom of the opening 2 of the resin case 1, thereby positioning and fixing the control terminal 13 in the resin case 1.

Figure 10A:
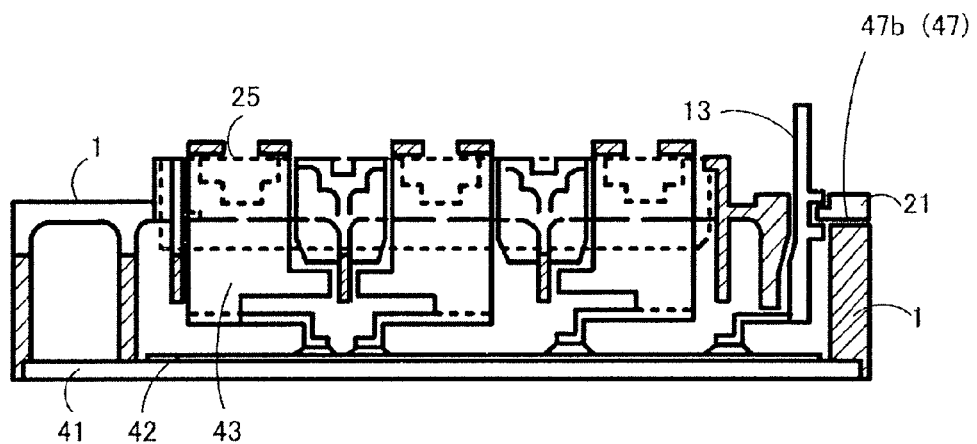
FIGS. 10(a), 10(b) are explanatory diagrams showing the semiconductor device of Embodiment 2 of the present invention which is in a manufacturing step following the one shown in FIGS. 9(a), 9(b).
Figure 10B:
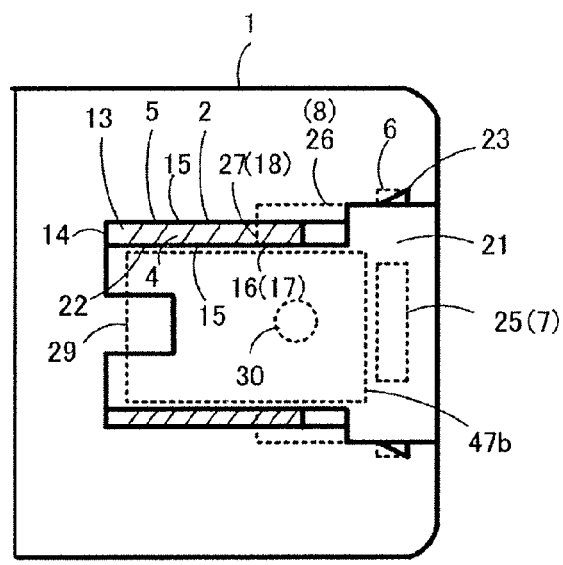

Thereafter, as shown in FIGS. 10(a), 10(b), the liquid adhesive 47a in the third concave portion 10 is solidified, to fix the beam portion 3 at the bottom of the opening 2 of the resin case 1 to the bottom surface 24 of the resin block 21 further rigidly. The resin block 21 may simply be fitted into the resin case 1 without using the adhesive 47.

(Embodiment 3)

Figure 11A:
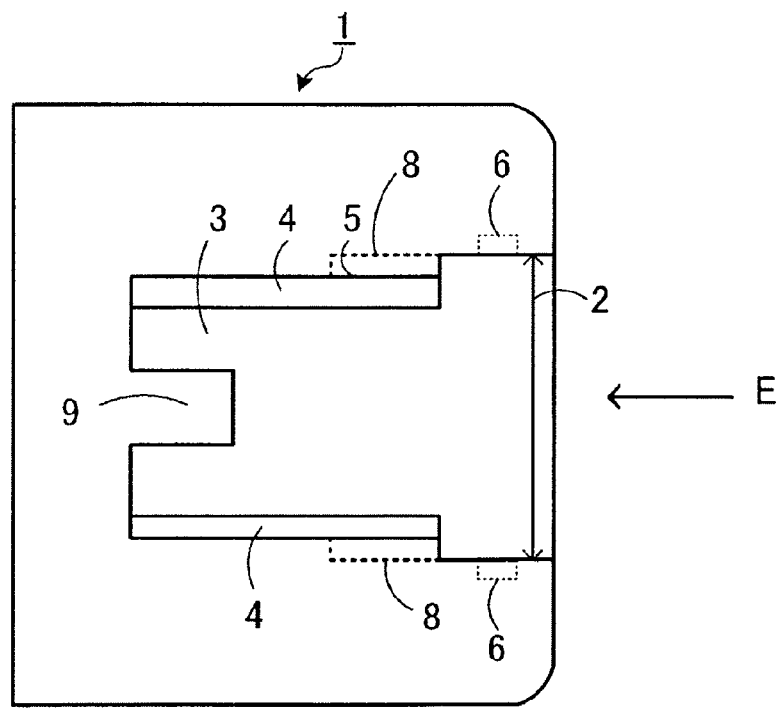
FIGS. 11(a), 11(b) are explanatory diagrams showing the configurations of substantial parts of a semiconductor device according to Embodiment 3 of the present invention.
Figure 11B:
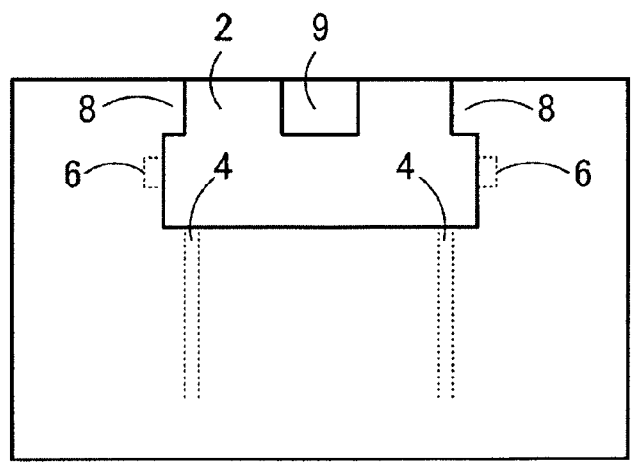
Figure 12A:
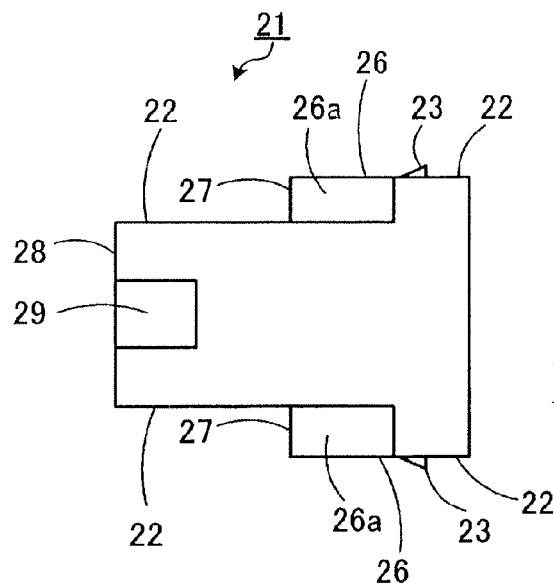
FIGS. 12(a)-12(c) are explanatory diagrams showing the configurations of substantial parts of the semiconductor device according to Embodiment 3 of the present invention.
Figure 12B:
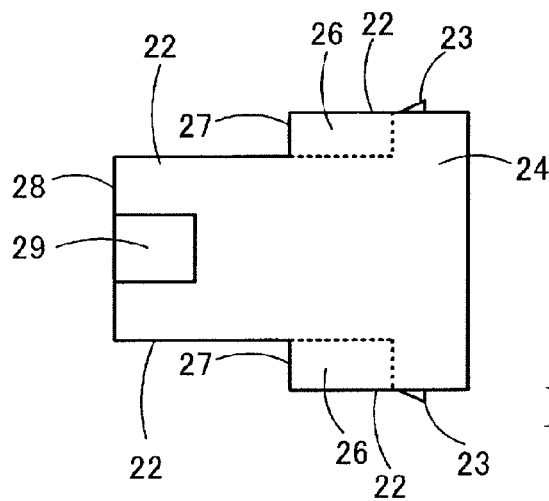
Figure 12C:
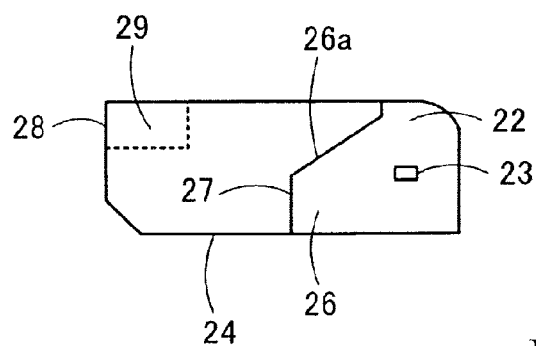
Figure 13:
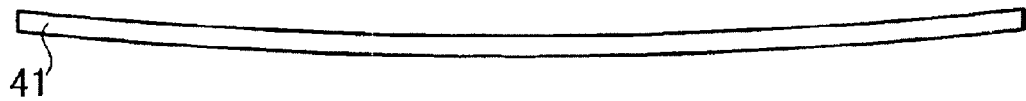
FIG. 13 is an explanatory diagram showing the semiconductor device of Embodiment 3 of the present invention in process of manufacture.

Another configuration of the semiconductor device of the present invention is now described as Embodiment 3 with reference to FIGS. 11(a), 11(b) and 12(a)-12(c). FIGS. 11(a), 11(b) and 12(a)-(c) are each an explanatory diagram showing the configurations of substantial parts of a semiconductor device according to Embodiment 3 of the present invention. The semiconductor device according to Embodiment 3 is a modification of the semiconductor device of Embodiment 1 shown in FIGS. 1(a) to 6. FIGS. 11(a), 11(b) show the other configurations of substantial parts near the control terminal of the resin case shown in FIG. 1. FIG. 11(a) is a plan view of the resin case 1. FIG. 11(b) is a front view of the resin case 1, showing FIG. 11(a) in the direction of the arrow E. FIGS. 12(a)-12(c) show the other configurations of the resin block by which the control terminal shown in FIGS. 1(a)-1(d) is positioned and fixed. FIG. 12(a) is a plan view of the resin block 21. FIG. 12(b) is a bottom view of the resin block 21. FIG. 12(c) is a side view of the resin block 21.

The semiconductor device of Embodiment 3 shown in FIGS. 11(a), 11(b) and 12(a)-12(c) is different from the semiconductor device of Embodiment 1 in that the resin block 21 is fitted into the openings 2 of the resin case 1 by press-fitting the resin block 21 into the openings 2 of the resin case 1 without using an adhesive. In particular, upper surfaces 26a of the convex step portions 26 on the side surfaces 22 of the resin block 21 are inclined downward from rear ends of the step portions 26 toward the front ends 27.

By taking advantage of the inclined upper surfaces 26a of the step portions 26, the front ends 27 of the step portions 26 are prevented from contacting the first hood portions 8 formed on the upper side of the sidewalls 5 of the opening 2 of the resin case 1, when the resin block 21 is inserted into the opening 2 of the resin case 1. Due to such a configuration, the resin block 21 can easily be inserted into the opening 2 of the rosin case 1.

Because the upper surfaces 26a of the step portions 26 are inclined so that the level of the rear ends of the step portions 26 is higher than that of the front ends 27, the upper surfaces 26a of the step portions 26 can be fitted in contact with the first hood portions 8 by press-fitting the resin block 21 into the opening 2 of the resin case 1 until the resin block 21 stops. As a result, the resin block 21 is fixed in place in the insertion direction (lateral direction) thereof. Due to the downward force applied from the resin case 1 to the resin block 21, the vertical position of the resin block 21 is determined. As with Embodiment 1, the third projections 23 formed on the side surfaces 22 of the resin block 21 are fitted into the first concave portions 6 on the sidewalk 5 of the opening 2 of the resin case 1, thereby fixing the resin block 21 in place in the direction (lateral direction) perpendicular to the insertion direction. Determining the vertical and lateral position of the resin block 21 in this manner can prevent the resin block 21 from being removed from the opening 2 of the resin case 1.

Further, as a result of press-fitting the resin block 21 into the opening 2 of the resin case 1 until the resin block 21 stops, the upright portion 13a of the control terminal 13 is turned inward by the resin block 21 and consequently fixed in contact with the front sidewall of the opening 2 of the resin case 1. Thus, the position of the control terminal 13 can be grasped based on the front sidewall of the opening 2 of the resin case 1. Even when the control terminal 13 joined to the patterned insulating substrate 42 is inclined toward the outside, the position of the control terminal 13 can be corrected by the resin block 21, improving the position accuracy of the control terminal 13. The configurations of the elements other than the upper surfaces 26a of the step portions 26 of the semiconductor device according to Embodiment 3 are the same as those of the semiconductor device shown in FIGS. 1(a) to 6.

In Embodiment 3, the resin block 21 can be fitted into the opening 2 of the resin case 1 without using an adhesive. This means that the third concave portion onto which an adhesive is dropped (or applied), the liquid reservoir for preventing the adhesive from flowing toward the control terminal, and the fifth projection on the bottom surface 24 of the resin block 21, are not required. Also, because the vertical movement of the resin block 21 can be inhibited by inclining the upper surfaces 26a of the step portions 26, neither the second concave portion on the lower side of the beam portion 3 of the resin block 21 nor the fourth projection on the bottom surface 24 of the resin block 21 is required. When the fourth and fifth projections are not provided on the bottom surface 24 of the resin block 21, it is not necessary to take into consideration the heights of the fourth and fifth projections to increase the width of the opening 2 of the resin case 1 in the thickness direction. Thus, the gap between the opening 2 of the resin case 1 and the resin block 21 in the thickness direction can be reduced.

A method of manufacturing the semiconductor device shown in FIGS. 11(a), 11(b) and 12(a)-12(c) is described next. FIGS. 13 to 18 are each an explanatory diagram showing the semiconductor device of Embodiment 3 of the present invention in process of manufacture. The heat dissipating base 41, made of copper (Cu), becomes thermally expanded and deformed as a result of being solder-joined to the patterned insulating substrate 42. For this reason, the heat dissipating base 41 is curved to the back into a convex shape beforehand in consideration of the fact that it deforms due to thermal expansion.

Figure 14:
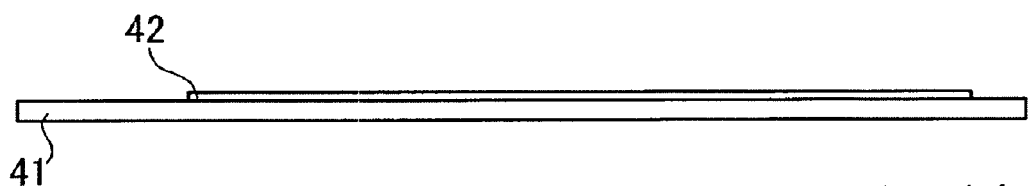
FIG. 14 is an explanatory diagram showing the semiconductor device of Embodiment 3 of the present invention in process of manufacture.

Next, the patterned insulating substrate 42 such as a ceramic insulating substrate (DCB substrate) is joined to the front surface of the heat dissipating base 41 via a solder-joint layer, not shown, therebetween, the heal dissipating base 41 being curved to the back into a convex shape. Because the heat dissipating base 41 is deformed beforehand in consideration of the fact that it deforms due to thermal expansion as described above, solder-joining the patterned insulating substrate 42 to the heat dissipating base 41 as shown in FIG. 14 eliminates the curve of the heat dissipating base 41 and makes it flat.

Next, the control terminal 13 and the main terminal 43 are soldered or welded to the circuit pattern of the patterned insulating substrate 42. The control terminal 13 and the main terminal 43 are normally joined at a temperature of approximately 260° C. However, since the melting point of solder is approximately 240° C., the solder joint layer joining the heat dissipating base 41 and the patterned insulating substrate 42 together might melt as a result of soldering or welding the control terminal 13 and the main terminal 43.

Figure 15:
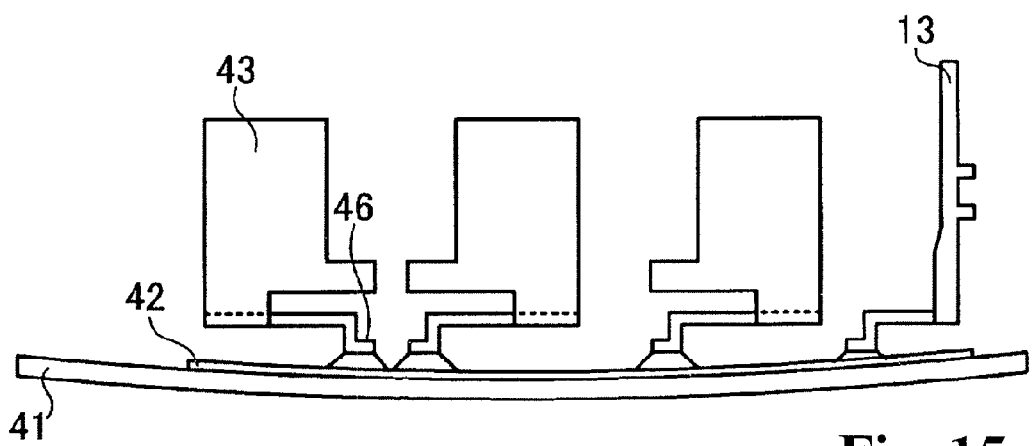
FIG. 15 is an explanatory diagram showing the semiconductor device of Embodiment 3 of the present invention in process of manufacture.

When the solder-joint layer for joining the heat dissipating base 41 and the patterned insulating substrate 42 melts, the heat dissipating base 41 returns to its initial state when it is deformed to the back into a convex shape, as shown in FIG. 15. Therefore, the control terminal 13 and the main terminal 43 are soldered or welded to the patterned insulating substrate 42 curved to the back into a convex shape, perpendicularly to, for example, a stage on which the heat dissipating base 41 is placed, as in the case where the patterned insulating substrate 42 is flat.

Figure 16:
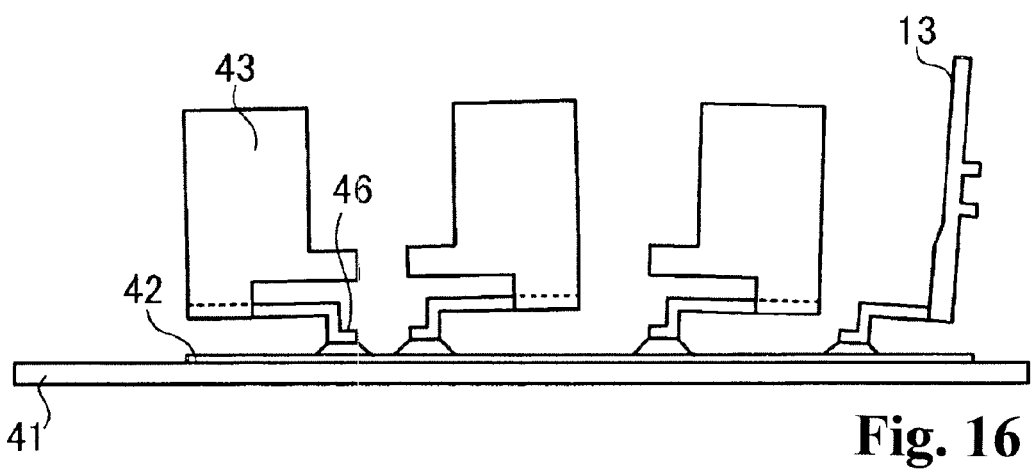
FIG. 16 is an explanatory diagram showing the semiconductor device of Embodiment 3 of the present invention in process of manufacture.

Thereafter, the solder-joint layer between the heat dissipating base 41 and the patterned insulating substrate 42 is cooled and solidified. The heat dissipating base 41 and the patterned insulating substrate 42 are consequently joined to each other again by the solder-joint layer, resulting in the elimination of the curve of the heat dissipating base 41 and making the heat dissipating base 41 and the patterned insulating substrate 42 flat. However, the control terminal 13 is joined to the patterned insulating substrate 42 when the patterned insulating substrate 42 is curved to the back into a convex shape, as described above. This means that, as shown in FIG. 16, the control terminal 13 is inclined to the outside after the curve of the heat dissipating base 41 and patterned insulating substrate 42 is eliminated. Consequently, the upper end of the control terminal 13 (the end that is exposed to the outside of the resin case 1) is shifted toward the outside.

Figure 17:
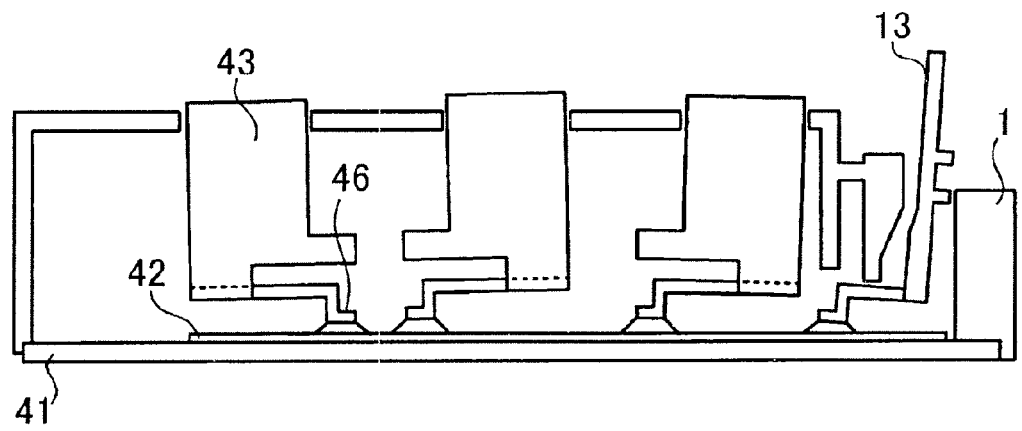
FIG. 17 is an explanatory diagram showing the semiconductor device of Embodiment 3 of the present invention in process of manufacture.

Next, as shown in FIG. 17, the resin case 1 is bonded to the rim of the patterned insulating substrate 42 so as to cover the patterned insulating substrate 42. In this case, the main terminal 43 is exposed from the upper side of the opening 44 of the resin case 1, and the control terminal 13 is passed through the through-hole 4 formed in the bottom of the opening 2. For the purpose of clearly illustrating the control terminal 13, a simplified resin case 1 is shown in FIG. 17 (in FIG. 18 as well).

Figure 18:
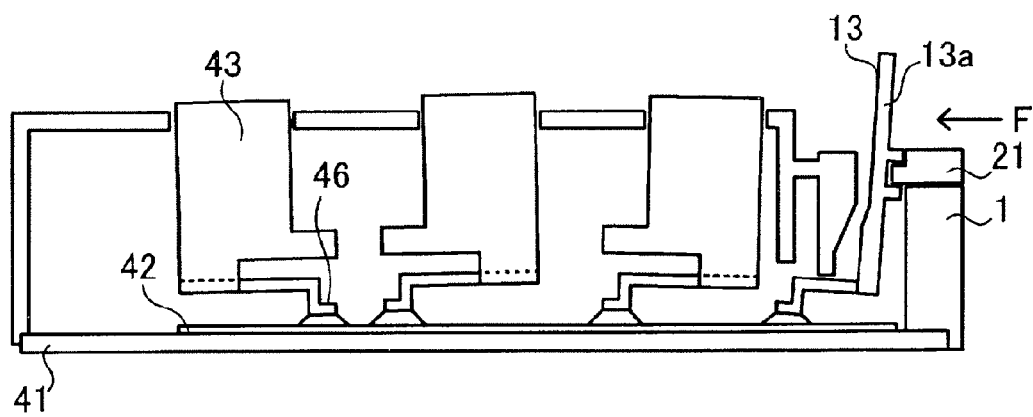
FIG. 18 is an explanatory diagram showing the semiconductor device of Embodiment 3 of the present invention in process of manufacture.
Figure 19:
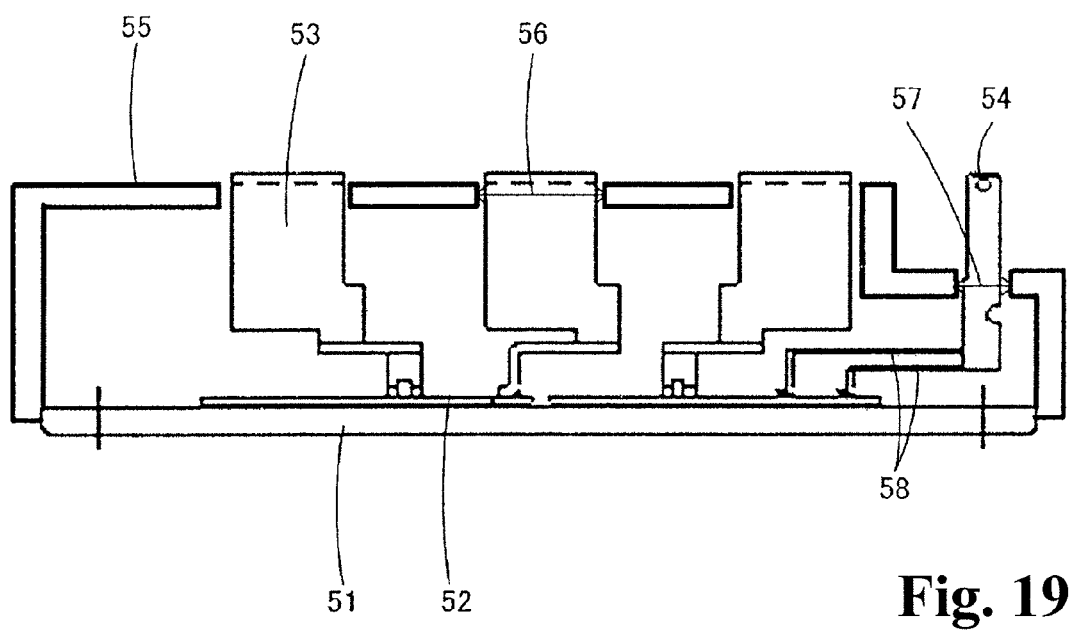
FIG. 19 is a cross-sectional diagram showing the configurations of substantial parts of a conventional IGBT module with independent terminals.

As shown in FIG. 18, the resin block 21 is inserted into the opening 2 of the resin case 1 so the front end 27 of the convex step portion 26 on each side surface 22 of the resin block 21 is fitted into the valley 18 formed between the first and second projections 16 and 17 of the control terminal 13. The resin block 21 is pressed into the opening 2 of the resin case 1 until the resin block 21 stops. Consequently, the upright portion 13a of the control terminal 13 is turned by the resin block 21 in the direction indicated by the arrow F, and the surface of the control terminal 13, opposite to the side end surface 14, contacts the front sidewall of the opening 2 of the resin case 1. As a result, the control terminal 13 is held by the front sidewall of the opening 2 of the resin case 1 and the front ends 27 of the resin block 21. The flat plate 15 of the control terminal 13 is also held by the sidewalls 5 of the opening 2 of the resin case 1 and the side surfaces 22 of the resin block 21.

The inclined upper surfaces 26a of the convex step portions 26 formed on the lower side of the side surfaces 22 of the resin block 21 are brought into contact with and fitted into the first hood portions 8 on the upper side of the opening 2 of the resin case 1, by press-fitting the resin block 21 into the opening 2 of the resin case 1. Within the opening 2 of the resin case 1, the third projections 23 on the side surfaces 22 of the resin block 21 are fitted into the first concave portions 6 which are formed on the sidewalls 5 of the opening 2 of the resin case 1. The resin block 21 is, therefore, fixed to the resin case 1 completely, and as a result the control terminal 13 is fixed in place in the lateral direction. Subsequently, the main terminal 43 is fixed by the nut globe 45 as shown in FIG. 1(b), completing the semiconductor device according to Embodiment 3.

According to each of the embodiments described above, by fitting the first and second projections of the side end surfaces of the control terminal to the convex step portions of the resin block inserted into the opening of the resin case, the control terminal can be fixed to the resin case so as not to be shifted by external force. Thus, even when external force such as a compressive load or tensile load is applied to the control terminal, the control terminal can be prevented from sinking into the resin case or being pulled out of the resin case.

In addition, according to the foregoing embodiments, the control terminal is fixed in place in the resin case by holding the control terminal between the side surfaces of the resin block and the sidewalls of the opening of the resin case and then fitting the convex step portions of the resin block into the valley between the first and second projections of the control terminal. This can accurately determine the position of the control terminal.

According to Embodiment 3, press-fitting the resin block into the opening of the resin case until the resin block stops, not only fixes the control terminal between the resin case and the resin block, but also determines the vertical and lateral position of the resin block. This can prevent the resin block from being removed from the opening of the resin case and fix the control terminal in place in the resin case. According to Embodiment 3, even when the control terminal that is bonded to the patterned insulating substrate is tilted to the outside, the control terminal can contact the front sidewall of the opening of the resin case by turning the upright portion of the control terminal inward by means of the resin block. Therefore, even when the control terminal that is bonded to the patterned insulating substrate is tilted to the outside, the control terminal can be fixed in place in the resin case so the position of the control terminal can be grasped accurately.

The present invention can be applied not only to each of the foregoing embodiments but also to semiconductor devices of various configurations. The present invention is described herein with an example in which the side end surface of the control terminal is provided with two projections and one valley therebetween, but the side end surface of the control terminal may be provided with three or more projections.

Industrial Applicability

As described above, the semiconductor device and the method of manufacturing the same according to the present invention are useful in a module semiconductor device in which an external lead terminal of a package is mounted on a patterned insulating substrate.

Explanation of Reference Numerals
  1 Resin case
  2, 2a, 2b Opening for inserting control terminal
  3 Beam portion
  4 Through-hole
  5 Sidewall of opening
  6 First concave portion
  7 Second concave portion
  8 First hood portion
  9 Second hood portion
  10 Third concave portion
  11 Liquid reservoir
  13 Control terminal
  13a Upright portion of control terminal
  13b Coupled portion of control terminal
  13c Joint of control terminal
  14 Side end surface
  15 Flat plate
  16 First projection
  17 Second projection
  18 Valley
  21, 21a, 21b Resin block
  22 Side surface of resin block
  23 Third projection
  24 Bottom surface of resin block
  25 Fourth projection
  26 Convex step portion on side surface of resin block
  26a Inclined upper surface of convex step portion on side surface of resin block
  27 Front end of convex step portion
  28 Front end of rosin block
  29 Concave groove of resin block
  30 Fifth projection (fitted into concave portion 10)
  31 Connector
  32 Dotted line near opening of resin case
  41 Heat dissipating base
  42 Patterned insulating substrate
  43 Main terminal
  44 Opening for inserting main terminal
  45 Nut globe
  46 Legs of main terminal
  47 Adhesive
  47a Liquid adhesive
  47b Solidified adhesive

What is claimed is:
1. A semiconductor device, comprising:
a control terminal attached to a patterned insulating substrate;
a first projection formed on the control terminal;
a second projection formed on the control terminal away from the first projection;

a valley formed between the first projection and the second projection;
a resin case disposed to cover the patterned insulating substrate, and having an opening for passing the control terminal therethrough;
a first concave portion formed on a sidewall of the opening of the resin case;
a beam portion disposed at a bottom portion of the opening of the resin case;
a second concave portion formed in the beam portion;
a resin block inserted into the opening of the resin case and sandwiching the control terminal together with the sidewall of the opening of the resin case to fix the control terminal to the resin case;
a convex step portion formed in the resin block to fit into the valley of the control terminal;
a third projection formed on a side surface of the resin block to fit into the first concave portion; and
a fourth projection formed on a bottom surface of the resin block to fit into the second concave portion.

2. The semiconductor device according to claim 1, wherein the bottom surface of the resin block and the beam portion are fixed with an adhesive.

3. The semiconductor device according to claim 2, wherein the beam portion comprises a liquid reservoir to prevent the adhesive in a liquid state from flowing toward the control terminal.

4. A semiconductor device, comprising:
a control terminal attached to a patterned insulating substrate;
a resin case disposed to cover the patterned insulating substrate, and having an opening for passing the control terminal therethrough;
a first step portion formed on an upper side of a sidewall of the opening of the resin case to project toward inside of the opening;
a resin block inserted into the opening of the resin case and sandwiching the control terminal with the sidewall of the opening of the resin case to fix the control terminal to the resin case; and
a convex second step portion formed on a side surface of the resin block, and having an inclined upper surface contacting the first step portion to fit therewith.

5. A semiconductor device, comprising:
a control terminal attached to a patterned insulating substrate;
a resin case disposed to cover the patterned insulating substrate, and having an opening, and a through hole extending from a bottom portion of the opening to connect an upper surface of the resin case and a side surface of the resin case for passing the control terminal therethrough; and
a resin block including a fitting portion to fit the opening of the resin case,
wherein the resin block is configured to press-fit into the opening of the resin case, and contact a part of the control terminal to turn the part of the control terminal to determine a position of the control terminal while contacting a sidewall of the opening.

6. A semiconductor device according to claim 5, wherein the resin case further includes a beam portion disposed at the bottom portion of the opening of the resin case, the beam portion comprising the through hole, another through hole spaced from the through hole, and a concave portion formed between said another through hole and the through hole; and
the resin block further comprises a projection formed on a bottom surface thereof to fit into the concave portion.

* * * * *

UNITED STATES PATENT AND TRADEMARK OFFICE
CERTIFICATE OF CORRECTION

PATENT NO.        : 9,078,355 B2
APPLICATION NO.   : 14/232780
DATED             : July 7, 2015
INVENTOR(S)       : Yoshihiro Kodaira It is certified that error appears in the above-identified patent and that said Letters Patent is hereby corrected as shown below:

Title Page, item (56) References Cited, under OTHER PUBLICATIONS, please change from "Machine English Translation of JP 200-183276…" to --Machine English Translation of JP 2000-183276…--.

In the specification

Please change column 1, line 65, from "…the control terminal 34…" to --…control terminal 54…--.

Please change column 10, line 40, from "…valley formed…" to --…valley 18 formed…--.

Signed and Sealed this
Twenty-second Day of March, 2016

Michelle K. Lee
*Director of the United States Patent and Trademark Office*